United States Patent
Confalonieri et al.

(10) Patent No.: US 7,675,449 B2
(45) Date of Patent: Mar. 9, 2010

(54) CURRENT STEERING DIGITAL-ANALOG CONVERTER PARTICULARLY INSENSITIVE TO PACKAGING STRESSES

(75) Inventors: Pierangelo Confalonieri, Caponago (IT); Marco Zamprogno, Cesano Maderno (IT); Riccardo Martignone, Carnate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/172,692

(22) Filed: Jul. 14, 2008

(65) Prior Publication Data

US 2009/0033531 A1 Feb. 5, 2009

(30) Foreign Application Priority Data

Jul. 30, 2007 (EP) ................... 07425478

(51) Int. Cl.
 *H03M 1/66* (2006.01)
(52) U.S. Cl. ...................... 341/144; 341/145
(58) Field of Classification Search ................. 341/144, 341/145
 See application file for complete search history.

(56) References Cited

U.S. PATENT DOCUMENTS

| | | | | |
|---|---|---|---|---|
| 5,483,150 A * | 1/1996 | Elliott et al. | ................. | 323/312 |
| 5,568,145 A | 10/1996 | Reynolds | | |
| 5,838,271 A * | 11/1998 | Park | ........................... | 341/144 |
| 5,844,515 A | 12/1998 | Park | | |
| 6,163,283 A * | 12/2000 | Schofield | ..................... | 341/50 |
| 6,456,218 B1 * | 9/2002 | Dedic et al. | .................. | 341/144 |
| 2006/0244646 A1 | 11/2006 | Ueno et al. | | |
| 2007/0090981 A1 | 4/2007 | Chou | | |

FOREIGN PATENT DOCUMENTS

| | | |
|---|---|---|
| EP | 1178611 A3 | 2/2002 |
| WO | 2005117402 A1 | 12/2002 |

OTHER PUBLICATIONS

Bastos et al., "A 12-Bit Intrinsic Accuracy High-Speed CMOS DAC," IEEE Journal of Solid-State Circuits 33 (12):1959-1969, Dec. 1998.
Van der Plas et al., "Mondriaan: a Tool for Automated Layout Synthesis of Array-type Analog Blocks," Proceedings of the IEEE Custom Integrated Circuits Conference, IEEE, Santa Clara California, May 11-14, 1998, pp. 485-488.
Van der Plas et al., "A 14-Bit Intrinsic Accuracy Q2 Random Walk CMOS DAC," IEEE Journal of Solid-State Circuits 34(12):1708-1718, Dec. 1999.

* cited by examiner

*Primary Examiner*—Jean B Jeanglaude
(74) *Attorney, Agent, or Firm*—E. Russell Tarleton; Seed IP Law Group PLLC

(57) ABSTRACT

A current steering digital-analog converter for converting a digital code into an analog signal, the converter including a substrate of semiconductor material, an array of current generators integrated in the substrate, a common summation node and switches controllable on the basis of the digital code for connecting and disconnecting the current generators to and from the common summation node. The current generators are adapted to provide the common summation node with currents having a multiple value according to a power of two compared to a unit current value provided to the summation node by a current generator of the array of generators. The current generator is divided into a base number of modular current generation elements in parallel to one another at least equal to two.

21 Claims, 5 Drawing Sheets

| D5 | D4 | D3 | D2 | DM1 | DM2 | DM3 | DM4 | DM5 | DM6 | DM7 | DM8 | DM9 | DM10 | DM11 | DM12 | DM13 | DM14 | DM15 |
|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 1 | 0 | 0 | 0 | 0 | 0 | 0 | 0 | 0 | 0 | 0 | 0 | 0 | 0 | 0 |
| 0 | 0 | 1 | 0 | 1 | 1 | 0 | 0 | 0 | 0 | 0 | 0 | 0 | 0 | 0 | 0 | 0 | 0 | 0 |
| 0 | 0 | 1 | 1 | 1 | 1 | 1 | 0 | 0 | 0 | 0 | 0 | 0 | 0 | 0 | 0 | 0 | 0 | 0 |
| 0 | 1 | 0 | 0 | 1 | 1 | 1 | 1 | 0 | 0 | 0 | 0 | 0 | 0 | 0 | 0 | 0 | 0 | 0 |
| 0 | 1 | 0 | 1 | 1 | 1 | 1 | 1 | 1 | 0 | 0 | 0 | 0 | 0 | 0 | 0 | 0 | 0 | 0 |
| 0 | 1 | 1 | 0 | 1 | 1 | 1 | 1 | 1 | 1 | 0 | 0 | 0 | 0 | 0 | 0 | 0 | 0 | 0 |
| 0 | 1 | 1 | 1 | 1 | 1 | 1 | 1 | 1 | 1 | 1 | 0 | 0 | 0 | 0 | 0 | 0 | 0 | 0 |
| 1 | 0 | 0 | 0 | 1 | 1 | 1 | 1 | 1 | 1 | 1 | 1 | 0 | 0 | 0 | 0 | 0 | 0 | 0 |
| 1 | 0 | 0 | 1 | 1 | 1 | 1 | 1 | 1 | 1 | 1 | 1 | 1 | 0 | 0 | 0 | 0 | 0 | 0 |
| 1 | 0 | 1 | 0 | 1 | 1 | 1 | 1 | 1 | 1 | 1 | 1 | 1 | 1 | 0 | 0 | 0 | 0 | 0 |
| 1 | 0 | 1 | 1 | 1 | 1 | 1 | 1 | 1 | 1 | 1 | 1 | 1 | 1 | 1 | 0 | 0 | 0 | 0 |
| 1 | 1 | 0 | 0 | 1 | 1 | 1 | 1 | 1 | 1 | 1 | 1 | 1 | 1 | 1 | 1 | 0 | 0 | 0 |
| 1 | 1 | 0 | 1 | 1 | 1 | 1 | 1 | 1 | 1 | 1 | 1 | 1 | 1 | 1 | 1 | 1 | 0 | 0 |
| 1 | 1 | 1 | 0 | 1 | 1 | 1 | 1 | 1 | 1 | 1 | 1 | 1 | 1 | 1 | 1 | 1 | 1 | 0 |
| 1 | 1 | 1 | 1 | 1 | 1 | 1 | 1 | 1 | 1 | 1 | 1 | 1 | 1 | 1 | 1 | 1 | 1 | 1 |

*FIG. 2*

| C1 | C2 | C3 | C4 |
|---|---|---|---|
| M1a | M9a | M3a | M11a |
| M10a | M2a | M7a | M4a |
| M5a | M13a | M12a | M15a |
| M14a | M6a | M3b | M8a |
| M1b | M9b | M7b | M11b |
| M10b | M2b | M12b | M4b |
| M5b | M13b | M3c | M15b |
| M14b | M6b | M7c | M8b |
| M1c | M9c | M12c | M11c |
| M10c | M2c | M3d | M4c |
| M5c | M13c | M7d | M15c |
| M14c | M6c | M12d | M8c |
| M1d | M9d | M3e | M11d |
| M10d | M2d | M7e | M4d |
| M5d | M13d | M12e | M15d |
| M14d | M6d | M3f | M8d |
| M1e | M9e | M7f | M11e |
| M10e | M2e | M12f | M4e |
| M5e | M13e | M3g | M15e |
| M14e | M6e | M7g | M8e |
| M1f | M9f | M12g | M11f |
| M10f | M2af | M3h | M4f |
| M5f | M13af | M7h | M15f |
| M14f | M6af | M12h | M8f |
| M1g | M9g | MD1a | M11g |
| M10g | M2g | MD0a | M4g |
| M5g | M13g | MD1b | M15g |
| M14g | M6g | DUMMY | M8g |
| M1h | M9h | MD1c | M11h |
| M10h | M2h | MD0b | M4h |
| M5h | M13h | MD1d | M15h |
| M14h | M6h | DUMMY | M8h |

*FIG. 4*

CURRENT STEERING DIGITAL-ANALOG CONVERTER PARTICULARLY INSENSITIVE TO PACKAGING STRESSES

BACKGROUND

1. Technical Field

The present disclosure relates to the technical field of digital-analog converters and, in particular, to a current steering digital-analog converter.

2. Description of the Related Art

In modern applications with integrated circuits, for example in mobile terminals for personal communication, the need to minimize the space occupied by the integrated circuits, both in vertical and in horizontal directions, is increasingly felt. In the practice, the production of smaller and thinner packages or the vertical piling of multiple integrated circuits in a same package or in multiple superimposed packages is increasing. Solutions are adopted to obtain these results wherein the tendency is to minimize the thickness of the integrated circuit semiconductor wafers and use new types of materials for plastic packages and new types of glues for gluing the bottom portion of the dice. Nevertheless, it has been observed that these solutions subject silicon to stress phenomena whose effects cause greater consequences than the more or less negligible effects found when using packages of the previous generation.

For example, the effects of the above stress phenomena negatively affect the performance of current steering digital-analog converters.

As known, in this kind of converter a digital input code to be converted is used for driving an array of current generators obtained in the substrate and suitably sized. In particular, in this type of converter, a digital driving code is used for connecting/disconnecting a fixed number of current generators to/from a common summation node for providing an analog signal corresponding to the digital code to be converted in output in either a direct or indirect mode (in the latter case for example through an operational).

This type of digital-analog converters is particularly sensitive to gradual disturbances of various nature, for example due to:

a gradual variation of the oxide thickness affecting a considerable portion of the area occupied by the converter, a voltage gradient on the masses that convey the currents to the converter, or a gradual variation of the package pressure on the wafer by piezo-electric effect is such as to vary the mobility features of the components.

An approach used in the known art for making the performance of a current steering converter less sensitive to such gradients consists in performing a scrambling of the positions of the various current generators of the converter in the portion of area intended for seating such generators, keeping each of the current generators concentrated in a portion of such area for reasons related to the ease of realization of the layout and to the advantage of area occupation.

The scrambling technique may further be applied together with the so-called thermometric coding of at least some of the bits of the digital code to be converted, generally the most significant bits, in order to improve the performance of the converters in terms of Differential Non-Linearity (DNL). This technique consists in the practice of replacing the digital input code with a more complex driving code, which also corresponds to the provision of a greater number of switches to be driven in the integrated circuit, so as to minimize the variations of the number of generators to be disconnected/connected from/to the common summation node for each unit increase/decrease of the digital code to be converted.

The Applicant has noted that the approach described above is such as to guarantee satisfactory performance of the converters if the disturbances have the features of a phenomenon affecting in a gradual and thus substantially deterministic manner the area occupied by the converter, and in particular occupied by the array of generators. However, such approach does not guarantee satisfactory performance if the integrated circuits are subject to strongly variable local and thus not gradual disturbances, which substantially lead to local alterations of the mobility and are of an accidental nature, that is, they are not predictable.

The Applicant has noted that such disturbances are a consequence of irregularities originating from the fillers used for the package or from glue blisters and are accentuated by the small thickness of the die with the contribution of the package pressure on the latter. Also such pressure is highly variable with temperature and increases at low temperatures, so this prevents effect compensation by a self-calibration of the converter when switched on because mobility variations are observed subsequent to temperature variations of the same converter during the operation thereof.

The need to provide a current steering digital-analog converter is therefore felt, capable of ensuring high performance even adopting the new packaging solutions described above, especially in the case wherein dice with particularly small thickness are used.

BRIEF SUMMARY

The present disclosure provides a digital-analog converter that in one embodiment includes a current steering digital-analog converter for converting a digital code into an analog signal. The digital-analog converter includes a substrate of semiconductor material; an array of current generators integrated in the substrate; a common summation node and switching circuitry controllable on the basis of the digital code for connecting and disconnecting the current generators to and from, respectively, the common summation node; the current generators adapted to provide the common summation node with currents having a multiple value according to a power of two compared to a unit current value provided to the summation node by a first current generator of the array of generators, the first current generator divided into a base number of modular current generation elements in parallel to one another at least equal to two, each of the remaining current generators of the array of current generators including a number of modular current generation elements coupled parallel to one another and equal in number to a multiple according to a power of two of the base number.

In accordance with another embodiment of the present disclosure, a circuit is provided that includes a digital-to-analog converter for converting a digital signal. The converter includes an array of current generators couplable to a first common node to provide the common node with currents having a multiple value according to a power of two, the current generators comprising a first current generator that includes a base number of current generating units at least equal to two that are coupled in parallel to each other, and the remaining current generators in the array of current generators each comprising a number of current generating units coupled in parallel to each other and equal in number to a multiple of a power of two of the base number of current generating units in the first current generator; and a current mirror branch coupled to the current generators at a second common node.

In accordance with another aspect of the foregoing embodiment, the circuit includes a plurality of switches, each switch of the plurality of switches coupled to a respective current generator of the array of current generators and responsive to a respective bit of the digital signal to couple and uncouple the respective current generator from the first common node.

In accordance with another aspect of the foregoing embodiment, the circuit includes a transcode unit coupled to the current generators and configured to transcode a plurality of significant bits of the digital input code to thermometric transcode.

BRIEF DESCRIPTION OF THE SEVERAL VIEWS OF THE DRAWING(S)

Further features and the advantages of the disclosure shall be better understood from the following detailed description of particularly preferred embodiments thereof, made by way of non-limiting examples with reference to the annexed figures, wherein:

FIG. 1a shows a simplified circuit diagram of a particularly preferred embodiment of a current steering digital-analog converter and provided with an array of current generators controllable by a digital driving signal;

FIG. 1b schematically shows a transcoding block for obtaining the driving signal of the generators of the array of FIG. 1a starting from a digital signal to be converted;

FIG. 2 shows a thermometric transcoding table;

FIG. 3 shows a preferred embodiment of matrix arrangement layout of the current generators of the converter of FIG. 1a; and FIG. 4 shows a table representation of an arrangement layout equivalent to that shown in the layout of FIG. 3.

DETAILED DESCRIPTION

Figure 1A:
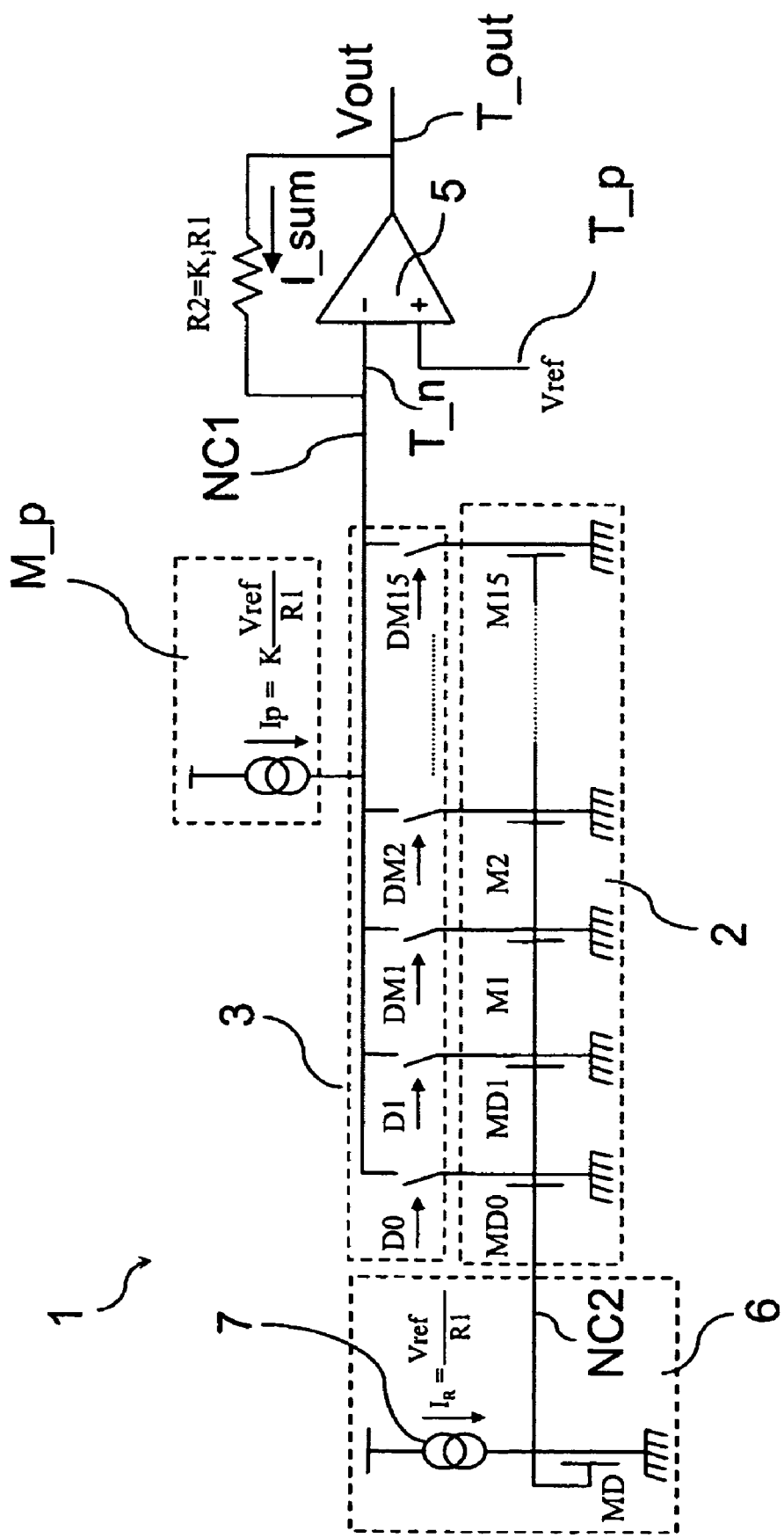

In the figures, elements that are equivalent or similar are be indicated by the same reference numerals.

In FIG. 1a, reference numeral 1 globally indicates an N-bit current steering digital-analog converter (DAC), which in the particular example shown in a non-limitative way is a single-ended DAC with N=6 bits. In the example, the digital-analog converter 1 is capable of receiving in input a digital code to be converted In_cod=D0, . . . , D5 with six bits, and in response to such digital input code it is such as to provide an analog signal corresponding to the digital code In_cod=D0, . . . , D5 received in input to an output terminal T_out. It is noted that while the present disclosure shall be described with reference to a single-ended DAC with N=6 bits, the teachings of the present description can be easily extended by one skilled in the art also to differential conversion structures or to digital-analog converters operating with a different number of bits.

The digital-analog converter 1 is made in the shape of an integrated circuit on a suitable substrate of semiconductor material, for example silicon.

The digital-analog converter 1 includes an array 2 of current generators MD0, MD1, M1, M2, . . . , M15, connectable to a common summation node NC1 by suitable switching means, such as for example an array 3 of respective switches, each driven by a respective bit of a driving code S_cod=D0, D1, DM0, DM1, . . . , DM15. Preferably, the current generators MD0, MD1, . . . , M1-M15 are MOS transistor, and in the example they are N type MOS, but in an alternative embodiment they may be P type MOS.

Figure 1B:
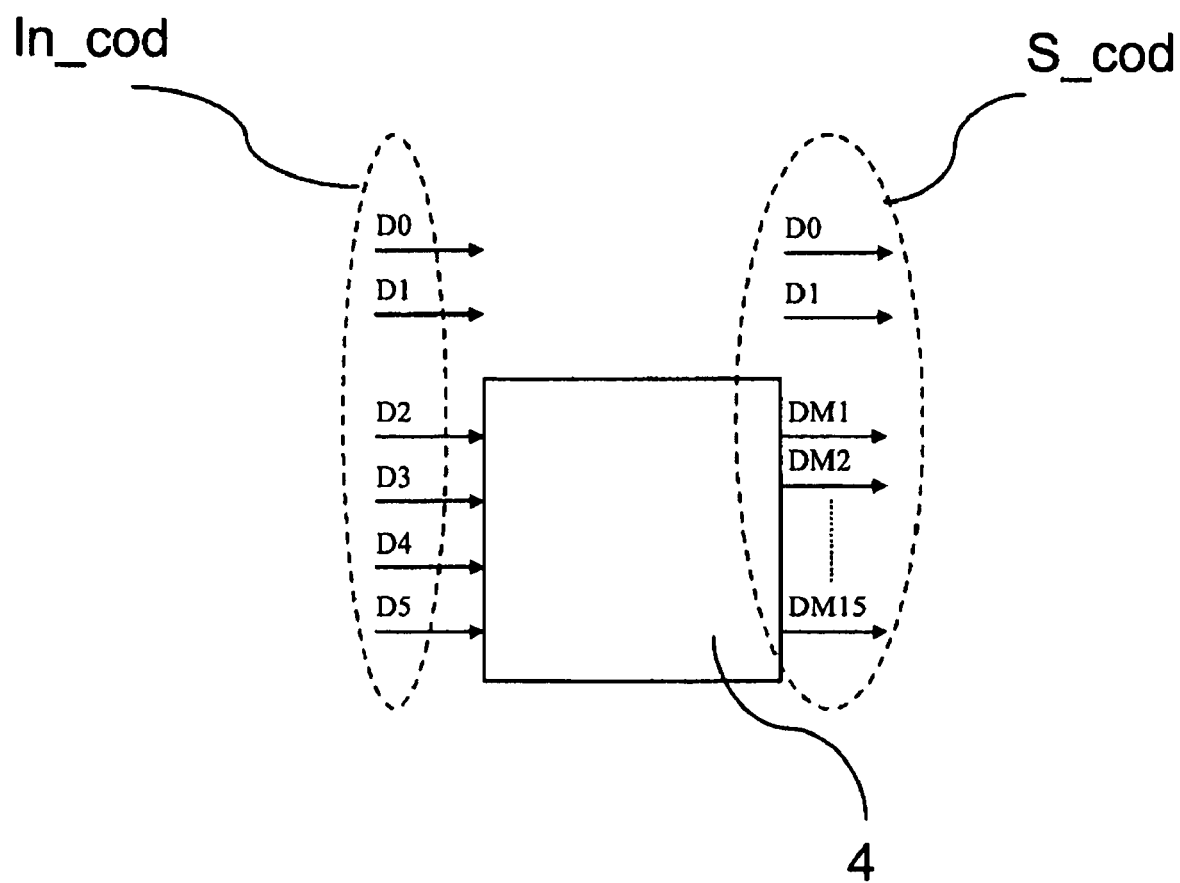

In the particularly preferred embodiment shown in FIG. 1a, the digital-analog converter 1 is an at least partial thermometric transcoding converter so the driving code S_cod=D0, D1, DM0, DM1, . . . , DM15 is obtained from the digital input code D0, D1, . . . , D5 by a thermometric transcoding unit 4 (FIG. 1b) of converter 1. Preferably, only the most significant bits D2, . . . , D5 of the digital input code In_cod are subject to thermometric transcoding while the remaining bits D0, D1 of such code are used for directly controlling the switches associated with the generators MD0, MD1 corresponding to the least significant bits of the digital input code D0, D1. In the particular example shown, therefore, the two least significant bits D0, D1 are not subject to thermometric transcoding whereas the remaining four most significant bits D2, . . . , D5 are used for obtaining the remaining fifteen bits of the driving code S_cod, for example according to the conversion table shown in FIG. 2. The use of the thermometric transcoding in digital-analog converters belongs to the knowledge of one skilled in the art, and so it shall not be further described in the present description.

Each of the current generators MD1, M1-M15 when connected to the common summation node NC1 is such as to provide the common summation node NC1 (or better pick up from such node) with currents having a multiple value according to a power of two compared to a current value, or unit current value, that can be picked up from the summation node NC1 by the current generator MD0 when the latter is connected to such node.

For example, the current generator MD1 is capable of picking up from node NC1 a current equal to twice the current that can be picked up from such node by the current generator MD0, while each of the remaining generators M1-M15 is adapted to pick up from the common summation node NC1 a current equal to the quadruple of the current that can be picked up from such node NC1 by the current generator MD0.

In order to obtain precise relations between the current values of the different generators of the array of generators 2, the current generators MD1-M15 are made in the form of generators consisting of multiple modular current generation elements connected in parallel to one another, in the example of multiple substantially identical elementary MOS connected in parallel.

Preferably, each of the current generators of array 2 of generators is connected according to a mirror current configuration to a current mirror branch 6 that includes:

a current generator 7, suitable for providing a reference current Ir=Vref/R1 obtained from the drop of a reference voltage Vref on a resistor R1, a pick up MOS MD connected to a diode and suitable for picking up such reference current for mirroring a fraction thereof in each of the current generators MD0-M15 of the array of generators 2 that at a given moment are connected to the common summation node NC1.

Also the pick up MOS MD is divided into a plurality of modular current generation elements (in the example elementary MOS) connected in parallel and for example identical to the modular generation elements the current generators MD1-M15 of the array of generators 2 are divided into.

It should be noted that in the example of FIG. 1a, the circuit consisting of the current mirror branch 6 and of array 2 of current generators forms a multiple current mirror wherein all the gate terminals of MOS MD0-M15 are connected to a common node NC2 connected to the gate terminal of MOS MD. The latter exhibits a diode configuration so its gate terminal is connected to its drain terminal. All the source terminals of MOS MD and MD0-M15 are connected to ground.

The sum of currents picked up by the current generators of array 2 at a given moment connected to the common node NC1 is indicated in FIG. 1a with I_sum at the operational amplifier 5.

In the particular embodiment shown in the figures, the digital-analog converter 1 includes an operational amplifier 5 having a inverting input terminal T_n connected to the summation node NC1 and a non inverting input terminal T_p fed by the reference voltage Vref (preferably the same obtained for obtaining the reference current). The latter is preferably equal to about half the feeding voltage of the digital-analog converter 1.

The operational amplifier 5 further includes an output terminal T_out for providing the analog voltage signal Vout in output and a resistor R2 connected between the inverting input terminal T_n and the output terminal T_out. It is therefore clear that in the configuration of FIG. 1a the operational amplifier 5 is such as to vary the output voltage Vout so that a current I_sum flows in resistor R2 equal to the sum of currents picked up by the common summation node NC1 when the generators MD0, MD1, M1-M15 at a given time are connected to such common summation node NC1. Moreover, it is clear that the value of resistor R2 determines the voltage gain of the output voltage Vout relative to the reference voltage Vref.

In an advantageous embodiment, converter 1 may further be provided with a polarization current generator M_p connected to the summation node NC1, suitable for generating a current Ip whose value is correlated to the reference voltage Vref which, allowing the lowering of the output polarization to a desired value, prevents the output voltage Vout from being too unbalanced to the feeding voltage.

Advantageously, the smallest current generator MD0 of array 2 of current generators includes a number of modular current generation elements connected to one another in parallel, or base number, at least equal to two. Hereinafter, in the present description reference is made, without introducing any limitations thereby, to an example wherein the smallest current generator MD0 in the array of generators 2 includes two modular current generation elements substantially identical to each other. Preferably, each of such modular current generation elements exhibits a length L equal to length $L_{eq}$ of an equivalent modular current generation element capable of picking up a current equal to the current picked up by the current generator MD0 but exhibits a width W equal to half width $L_{eq}$ of such equivalent modular current generation element.

In an alternative embodiment the current generator MD0 is divided into at least four modular current generation elements, for example into eight modular current generation elements substantially identical.

In a particularly preferred embodiment, the base number of modular current generation elements of the smallest generator MD0 is designed so that width W of the modular current generation element is less than a typical estimated size of a local disturbance. Disturbance means any phenomenon, typically of stress, intended for modifying the mobility of the devices made in the integrated circuit. For example, with the new packages mentioned in the introductory part of the present description, satisfactory results in terms of resistance to local disturbances have been obtained by breaking up the smallest generator MD0 into multiple modular current generation elements substantially identical to one another, in the practice elementary MOD, connected in parallel and having width W equal to 2.5 micron, the typical size of local disturbances having been estimated in the range of 5-10 micron.

The remaining current generators of array MD1, M1, ..., M15 include a number of modular current generation elements equal to a multiple according to powers of two of the base number, said modular elements being devices substantially identical to the modular elements the current generator MD0 is divided into. In the particular example described, the current generator MD1 includes four modular current generation elements connected to one another in parallel, while each of the remaining thermometric transcoding generators M1, ..., M15 include eight modular current generation elements connected to one another in parallel. If the modular current generation element is a MOS transistor, the connection in parallel can be obtained by metallization obtained in the integrated circuit connecting all the drain terminals of the modular elements of a same current generator of array 2 together.

Preferably, also the semiconductor device forming the pick up diode MD of the reference current Iref shall be formed of a certain number (multiple of said base number according to a power of two) of modular current generation elements substantially identical to the modular elements that make up the current generator MD0.

Figure 3:
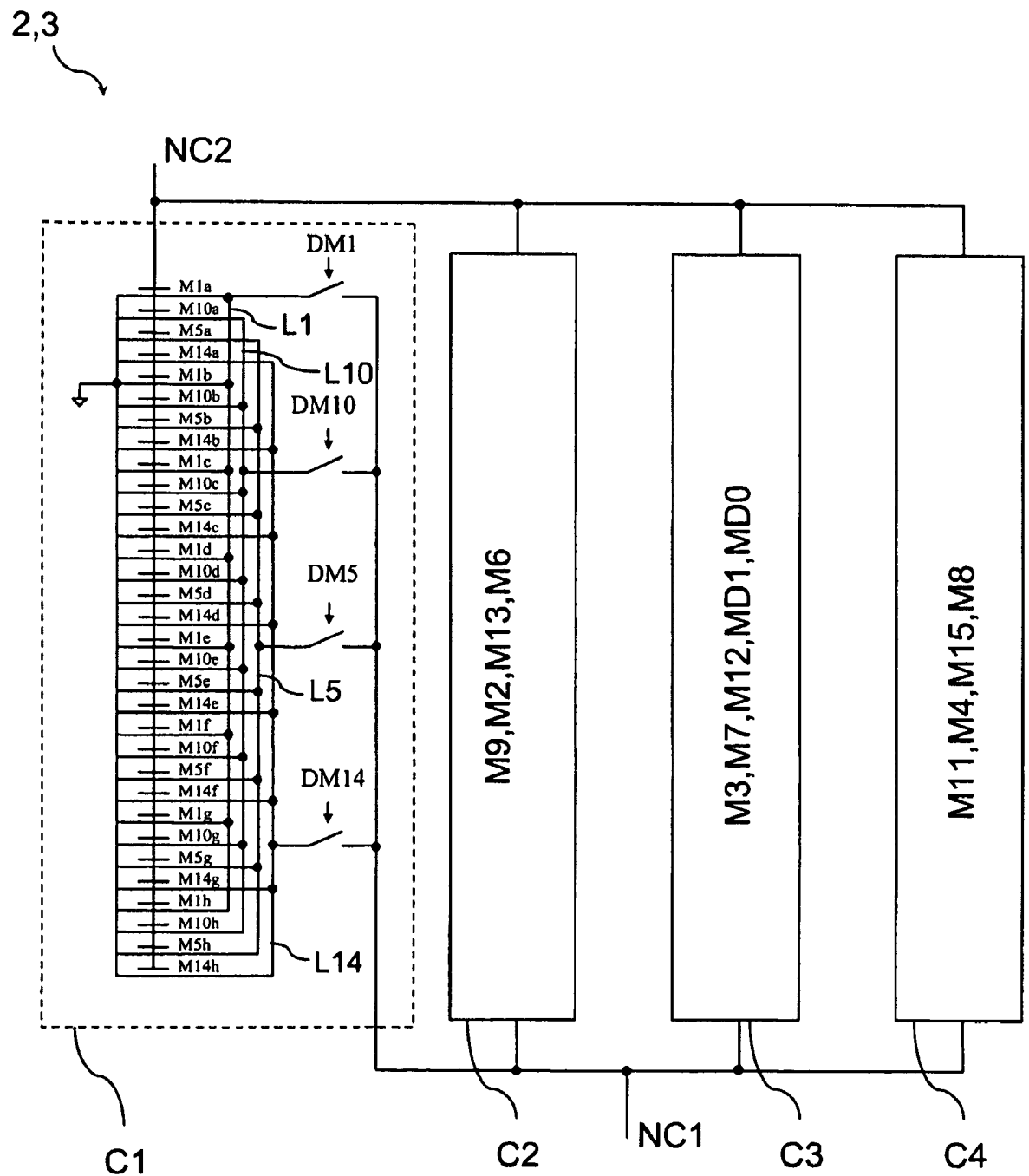

FIG. 3 shows a possible layout of spatial distribution of the modular current generation elements belonging to the array of generators 2 and of the relevant switching means or switches in the integrated circuit substrate. It should be noted that such spatial distribution corresponds to a spatial distribution of the modular elements according to a matrix layout, which in the example described consists of four columns C1, C2, C3, C4. The current generators M1, M5, M10, M14 are arranged in a first column C1, the current generators M2, M6, M9, M13 are arranged in a second column C2 and so on. Of course, it would be possible to devise a totally different arrangement organized by lines rather than columns.

By way of an example only, column C1 exhibits some details represented schematically at a circuit level. It is deemed that the man skilled in the art, starting from the circuit diagram represented for column C1, or using the equivalent table representation shown in FIG. 4, should be able to "expand" the remaining columns C2, C3, C4 accordingly.

In column C1:

M1a, M1b, M1c, ..., M1h indicate the eight modular generation elements that make up the current generator M1;

M5a, M5b, M5c, ..., M5h indicate the eight modular generation elements that make up the current generator M5;

and so on, for the remaining current generators M10, M14 arranged in column C1.

By analyzing FIG. 3 it can be seen that modular current generation elements of a same current generator have been scrambled in a same column, so that the scanning the matrix arrangement layout along a column adjacent modular elements belonging to distinct generators located in the column are found. Advantageously, such criterion of scrambling of the modular elements in the column has been adopted so that the minimum distance between two modular current generation elements belonging to a same current generator is maximized (this applies at least to the modular elements of the so-called thermometric current generators M1-M15) inside a same column.

As can be seen in FIG. 3, metallization lines L1, L5, L10, L14 have been provided for connecting in parallel modular elements belonging to as same current generator having a length about equal to a side of the matrix. In the diagram in FIG. 3 in particular, such metallization lines L1, L5, L10, L14 connect the drain terminals of the modular elements of a same current generator to one another.

In a particularly preferred embodiment not shown in the figures, it is possible to almost evenly scramble in the matrix distribution layout wherein the modular elements of array 2 of current generators MD0-M15 are scrambled, also the modular current generation elements of the pick up diode MD. This device exhibits a first advantage in that it further increases the distances between modular elements of a same current generator of array 2 and exhibits a second advantage consisting of the fact of making the digital-analog converter less sensitive to gain errors of diode MD due to disturbances of a local nature that could affect such diode MD if it was not distributed in the matrix but rather concentrated.

Moreover, if the digital-analog converter is segmented and includes a first array of current generators, or upper array, and a second array of current generators, or lower array, it is preferable that at least the upper array be made with a division into modular elements and preferably with a spatial distribution of such modular elements as described above with reference to array 2 of current generators. Optionally, it is also possible to envisage such division into modular elements also for the lower array, wherein the smallest current generator divided into modular elements is to be understood always as the smallest generator of the upper array, and envisage a scrambled spatial distribution of such modular elements in the same matrix containing the modular elements of the upper array, envisaging an optional alternation between modular elements of the upper array with modular elements of the lower array.

Experimental tests and simulations have shown that a digital-analog converter according to the present disclosure exhibits a particular resistance to local and non gradual disturbances, for example like those the integrated circuits are subject to in the new generation packages.

It should be noted that in using a DAC of the type described above, it is also possible to make analog-digital converters particularly insensitive to local and accidental disturbances (that is, not deterministic) in new generation packages, for example for the use in mobile personal communication devices.

It is evident that one skilled in the art may make several changes and adjustments to the digital-analog converter according to the present disclosure in order to meet specific and incidental needs, all falling within the scope of protection of the disclosure as defined in the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A current steering digital-analog converter for converting a digital code into an analog signal, the digital-analog converter comprising:
   a substrate of semiconductor material;
   an array of current generators integrated in said substrate;
   a common summation node and switching means controllable on the basis of said digital code for connecting and disconnecting said current generators to and from, respectively, said common summation node;
   the current generators adapted to provide the common summation node with currents having a multiple value according to a power of two compared to a unit current value provided to said summation node by a first current generator of said array of generators,
   said first current generator divided into a base number of modular current generation elements in parallel to one another at least equal to two, each of the remaining current generators of said array of current generators comprising a number of modular current generation elements coupled parallel to one another and equal in number to a multiple according to a power of two of said base number.

2. The digital-analog converter according to claim 1 wherein said modular current generation elements comprise MOS transistors.

3. The digital-analog converter according to claim 1 wherein the modular current generation elements belonging to at least some of the current generators of the array are made on said substrate according to a matrix spatial distribution layout, in such spatial distribution that in a scan of said matrix by columns or lines, adjacent modular elements belong to different current generators of said array.

4. The digital-analog converter according to claim 3 wherein said spatial distribution is such as to maximize the minimum distance between modular generation elements belonging to a same current generator of said array.

5. The digital-analog converter according to claim 1, wherein at least a part of said current generators suitable for providing said summation node with currents corresponding to the most significant bits of said digital code are connectable to said summation node by a driving code of said switching means obtained from said digital code by a thermometric transcoding.

6. The digital-analog converter according to claim 4 wherein said substrate comprises metallization lines suitable for connecting in parallel modular current generation elements belonging to a same current generator and having a length substantially equal to a dimension of a side of said matrix.

7. The digital-analog converter according to claim 4 further comprising a current mirror branch comprising a pick up diode of a reference current, said current mirror branch connected to said array so as to form with the generators of said array a multiple current mirror, said pick up diode comprising a number of modular elements equal to a multiple of said base number, and wherein the modular elements of said pick up diode are scrambled substantially evenly in said matrix.

8. The digital-analog converter according to claim 1 wherein said divided current generator is adapted to provide said common summation node with a current contribution corresponding to the least significant bit of said digital code to be converted.

9. The digital-analog converter according to claim 1 wherein said converter comprises a converter divided into a lower array and an upper array and wherein said array of generators represents said upper array, said divided current generator comprising the smallest generator in the upper array.

10. The digital-analog converter according to claim 4 wherein current generators of said lower array are also divided into said modular current generation elements, said modular current generation elements of the lower array are scrambled in said matrix together with modular elements of the current generators of said array.

11. The digital-analog converter according to claim 2 wherein said modular current generation elements are substantially identical.

12. The digital-analog converter according to claim 11, wherein said base number is equal to two and wherein each of said modular elements comprises a MOS transistor having:
  a length L equal to the length of an equivalent modular current generation element capable of providing a current equal to the current provided by said current generator to said common node;
  a width W equal to half the width of such equivalent modular element.

13. The digital-analog converter according to claim 2 wherein said base number is determined so that a width W of said modular elements is less than a typical estimated size of a local disturbance.

14. The digital-analog converter according to claim 13 wherein said width W is about equal to 2.5 micron.

15. The digital-analog converter according to claim 1 wherein said base number is at least equal to four.

16. The digital-analog converter according to claim 1 wherein said base number is at least equal to eight.

17. A digital-analog converter, comprising: a digital-analog converter according to claim 1.

18. A personal communication terminal, comprising: a digital-to-analog converter according to claim 1.

19. A circuit, comprising:
  a digital-to-analog converter for converting a digital signal, the converter comprising an array of current generators couplable to a first common node to provide the common node with currents having a multiple value according to a power of two, the current generators comprising a first current generator that includes a base number of current generating units at least equal to two that are coupled in parallel to each other, and the remaining current generators in the array of current generators each comprising a number of current generating units coupled in parallel to each other and equal in number to a multiple of a power of two of the base number of current generating units in the first current generator; and
  a current mirror branch coupled to the current generators at a second common node.

20. The circuit of claim 19, comprising a plurality of switches, each switch of the plurality of switches coupled to a respective current generator of the array of current generators and responsive to a respective bit of the digital signal to couple and uncouple the respective current generator from the first common node.

21. The circuit of claim 20, further comprising a transcode unit coupled to the current generators and configured to transcode a plurality of significant bits of the digital input code to thermometric transcode.

* * * * *